United States Patent [19]

Brown

[11] Patent Number: 5,286,607
[45] Date of Patent: Feb. 15, 1994

[54] BI-LAYER RESIST PROCESS FOR SEMICONDUCTOR PROCESSING

[75] Inventor: Andrew V. Brown, Singapore, Singapore

[73] Assignee: Chartered Semiconductor Manufacturing Pte Ltd., Singapore, Singapore

[21] Appl. No.: 803,541

[22] Filed: Dec. 9, 1991

[51] Int. Cl.$^5$ .......................... G03C 5/00; G03F 7/36
[52] U.S. Cl. .................... 430/313; 430/311; 430/323; 430/324; 430/325; 156/643; 156/644; 156/651; 156/659.1
[58] Field of Search ............... 430/311, 313, 314, 325, 430/394, 323, 324; 156/643, 644, 646, 651, 659.1, 660

[56] References Cited

U.S. PATENT DOCUMENTS

| | | | |
|---|---|---|---|
| 4,738,916 | 4/1988 | Namatsu | 430/272 |
| 4,810,601 | 3/1989 | Allen | 430/18 |
| 4,882,008 | 11/1989 | Garza | 156/643 |
| 5,100,503 | 3/1992 | Allman | 430/323 |

Primary Examiner—Marion E. McCamish
Assistant Examiner—Kathleen Duda
Attorney, Agent, or Firm—George O. Saile

[57] ABSTRACT

A multi-level patterning process for use in the semiconductor fabrication technology that will consistently produce a very fine and well defined pattern, and which can be re-worked, especially at the early stages of the process is accomplished. In the process, a thick resist, such as a Novolak resin with suitable additives is spun on a wafer. This material is heavily dyed to the exposing wave length of the radiant energy source of the stepper. The planerizing layer is exposed to a silicon containing atmosphere, such as hexamethyldisilazane (HMDS) for a period of time and a temperature sufficient for the silicon to penetrate a short distance, for example about 0.25 micrometers into the resist. The resist is crosslinked during this bake or during a subsequent bake. These wafers are now ready for standard resist processing. The resist is spun, exposed, and developed. The wafers are then inspected for error. Rework can be accomplished at the stage by stripping the top resist and re-coating. After inspection, the wafers go through a short RIE that transfers the pattern down through the silicon containing layer. This etch is then converted to an oxygen gas only etch that etches the rest of the way through the planerizing layer. The silicon containing resist layer acts as an etch mask. The wafer has now completed the lithography step and is ready for further processing.

18 Claims, 2 Drawing Sheets

BI-LAYER RESIST PROCESS FOR SEMICONDUCTOR PROCESSING

BACKGROUND OF THE INVENTION

(1) Field of the Invention

The present invention relates to a method of manufacturing integrated circuits and other electronic devices. More particularly, the invention relates to an improved process for photoresist patterning in the manufacture of integrated circuits and other electronic devices.

(2) Description of the Prior Art

The manufacture of integrated circuits requires an accurate and precise method to form patterns on wafers to delineate the areas for subsequent doping, isolation, interconnections, etc. The technology involved in the generation of these patterns is known as microlithography and in general involves the following steps: (a) a mask or reticle is made with the required information, (b) a thin layer of a photoresist is coated, as by spin coating onto the wafer, (c) the photoresist is exposed through the mask using the appropriate radiation, such as ultraviolet light, E beam, X-ray, or the like and (d) a relief mask is formed using a suitable solvent called the developer.

The development of photoresist patterns in applications is especially suitable for lithographic definition of very small features. These techniques, in general, employ a top imaging layer, an intermediate layer to be used as a mask, and a bottom planerizing layer. These schemes, however, increase process complexity and expense.

Surface-sensitive processes, where only the surface of the resist needs to be exposed, offer the performance advantages of multilayer schemes with the simplicity of single layer processing. One of the best known processes is the so-called "Desire" process. This process consists in selectively incorporating silicon-containing species in the exposed areas of the photoresist from the gas phase using a silylating agent such as hexamethyldislazane amine, HMDS. In an oxygen plasma, the regions that have incorporated silicon, turn into silicon dioxide. This protects the underlying photoresist from the oxygen plasma, whereas the unexposed regions are etched away in the plasma, with the end result that a positive relief image is formed.

Some of the other dominant schemes are described as follows:

In the bilayer process, resist on polymethylemethacrylate (PMMA) is accomplished by spinning PMMA and baking to drive off the solvent. Resist is spun and baked, then exposed and developed. The PMMA is exposed to ultraviolet light where the resist has to be removed. The PMMA is then developed. The advantages of this technique are the high resolution and good linewidth control of the resist layer, because it is on a planerized antireflective layer. The disadvantages are the poor thermal stability of the PMMA, interfacial mixing of the resist and PMMA, linewidth measurement, difficulty of rework, and inability to do in-line with a stepper.

In the trilayer process, resist on glass on polymer is accomplished by spinning a planerizing antireflective polymer onto the substrate. Then Spin-On-Glass (SOG) is spun or another inorganic layer is sputtered onto the antireflective polymer layer. Next resist is spun on the inorganic layer, exposed and developed. The inorganic layer is etched and then used as a mask for etching the planerizing polymer. The advantages of this technique are the same as the bilayer technique plus good thermal stability of the planerizing substrate and no interfacial mixing. The disadvantages are high defect density, high cost, high cycle time, need for develop etch, and inability to do in-line with stepper.

In the "Promis" or "Desire" process, surface imaging dry develop is accomplished by spinning photoresist. The resist is exposed, baked, and put in a silane (HMDS or other) atmosphere. The silane diffuses into the exposed resist and reacts with the phenol group. This incorporates silicon into the exposed area. The resist is then developed by putting the wafer through reactive ion oxygen etching. The silicon acts as an etch mask. The advantages of this process are extremely high resolution and depth of focus, low cost and short lithography cycle time. The disadvantages are (1) difficult development, because there is no pattern as yet and (2) one cannot know if the pattern is a good one and whether it is worthwhile to proceed with further processing, (3) poor linewidth control, due to softbake sensitivity and non-uniform silicon layer, (4) swelling (overlay control), and (5) need for develop etch.

Workers in the field have published actively and patents of general interest to the present invention include Reichmanis et al U.S. Pat. No. 4,481,049 "Bilevel Resist"; Grieco et al U.S. Pat. No. 4,532,005 "Device Lithography Using Multi-Level Resist Systems"; Hult et al U.S. Pat. No. 4,551,418 "Process for Preparing Negative Relief Images with Catonic Photopolymerization"; Ito et al U.S. Pat. No. 4,552,833 "Radiation Sensitive and Oxygen Plasma Developable Resist"; Namatsu et al U.S. Pat. No. 4,738,916 "Intermediate Layer Material of Three-Layer Resist System"; Mimura et al U.S. Pat. No. 4,751,170 "Silylation Method onto Surface of Polymer Membrane and Pattern Formation Process by the Utilization of Silylation Method"; Allen et al U.S. Pat. No. 4,810,601 "Top Imaged Resists"; Maheras et al U.S. Pat. No. 4,859,573 "Multiple Photoresist Layer Process Using Selective Hardening"; and Garza et al U.S. Pat. No. 4,882,008 "Dry Development of Photoresist".

SUMMARY OF THE INVENTION

An object of the invention is to provide an improved multi-level patterning process for use in the semiconductor fabrication technology that will consistently produce a very fine and well defined pattern, and which can be re-worked, especially at the early stages of the process.

In the process, a thick resist, such as a Novolak resin with suitable additives is spun on a wafer. This material is heavily dyed to the exposing wave length of the radiant energy source of the stepper. The planarizing layer is exposed to a silicon containing atmosphere, such as hexamethyldisilazane (HMDS) for a period of time and a temperature sufficient for the silicon to penetrate a short distance, for example about 0.25 micrometers into the resist. The resist is crosslinked during this bake or during a subsequent bake. These wafers are now ready for standard resist processing. The resist is spun, exposed, and developed. The wafers are then inspected for error. Rework can be accomplished at the stage by stripping the top resist and recoating. After inspection, the wafers go through a short RIE that transfers the pattern down through the silicon containing layer. This etch is then converted to an oxygen gas only etch that etches the rest of the way through the planerizing layer. The silicon containing resist layer acts as an etch mask. The wafer has now completed the lithography step and is ready for further processing.

High resolution is obtained by using a thin resist on an index matched, antireflective, planarized substrate like the bilayer and trilayer techniques. High thermal stability is obtained because the planerizing layer is a crosslinked Novolak based polymer. Interfacial mixing is eliminated because the planerizing layer is highly crosslinked. Develop Inspect (DI) can be accomplished on the developed resist pattern reducing rework problems. Linewidth control is good because of the reasons stated earlier, and the direct transfer of the by reactive ion etching (RIE) through a uniform silicon layer. This can be done in-line with a stepper.

BRIEF DESCRIPTION OF THE DRAWINGS

The present invention will be described with reference to accompanying drawings, wherein.

DESCRIPTION OF THE PREFERRED EMBODIMENTS

Figure 1:
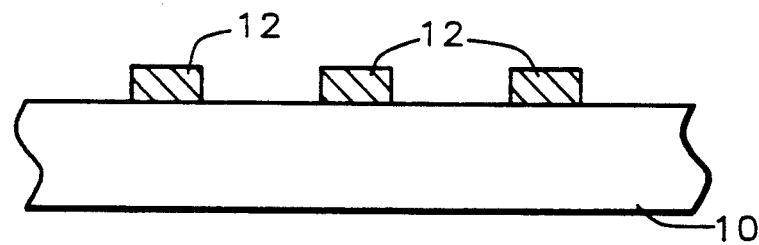
FIGS. 1 through 7 are a sequence of schematic elevational cross-sectional views, in broken section, which depict a semiconductor wafer at various stages of the practice of the process of the invention.
Figure 2:
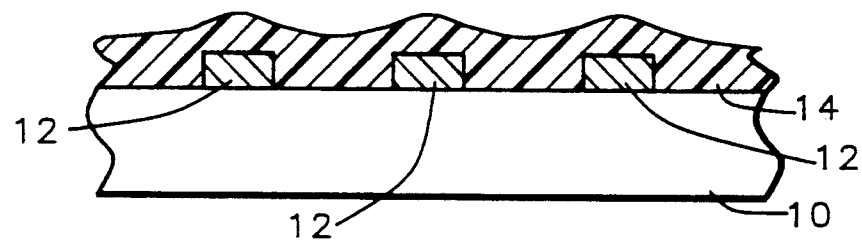

Referring now to the drawings, FIG. 1 depicts a semiconductor substrate 10 with a pattern 12 on the top surface. Note that the top of substrate 10 presents a non-planar surface due to the pattern 12. As shown in FIG. 2, a relatively thick planarizing resist, such as a Novolak based resist layer 14 is spun on substrate 10. The requirement of the material of this layer 14 is that it be capable of absorbing or allowing silicon from a silicon containing atmosphere or other medium to penetrate it. It is not necessary that the layer 14 undergo a chemical change upon exposure to radiation. It is only necessary that the material of layer 14 be removable with an oxygen plasma. Typical materials suitable for use in layer 14 are Novolak based polymers; polyphenol type polymers like Bakelite; and photoresists like Hunt 204, AZ1518, Shipley 1400, Shipley SPR2, TOK 8900. Also, it is possible to use polyepoxides, polyimides, polyvinyl alcohol, and the like.

The thickness of layer 14 depends on the size of the irregularities on the substrate, i.e. pattern 12 or other irregularities. In general the thickness of layer 14 is in the range of about 0.8 to 3.0 more preferable from 0.8 to 1.5 micrometer. It is also very desirable to incorporate a dye in layer 14 that absorbs radiation of the wave length which will be used to pattern the resist layer, as will be explained. The dye will prevent reflections within the layer. Typical dyes for use in the practice of the invention are common dyes, benzylphenones, and the like. The amount of dye in the material of layer 14 is typically in the range of 0.1% to 5.0%.

Figure 3:
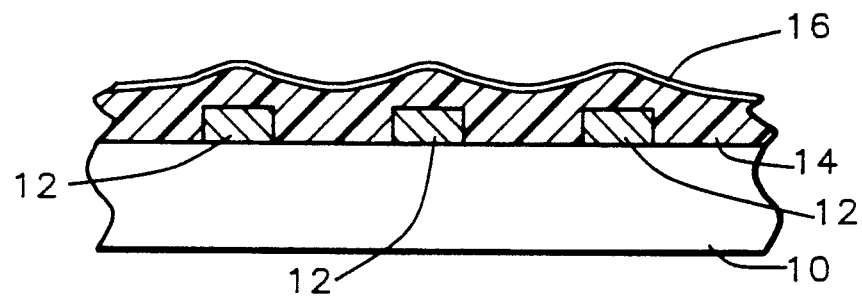

As shown in FIG. 3, the layer 14 is exposed to a medium that contains silicon. Preferably the medium is a silicon containing atmosphere such as hexamethyldisilazane (HMDS). Other suitable atmospheres include tetramethyldisilazane, bis-aminosilozane, hexamethylcyclotrisilazane, and the like. The layer 14 is exposed to the silicon containing atmosphere for a time and at a temperature to cause silicon from the medium to penetrate the top portion of layer 14, preferably the penetration depth is between about 0.1 to 0.5 micrometers and typically the depth is about 0.25 micrometers. The silicon penetration layer is indicated as 16 in FIG. 3. Typically the temperature is in the range of 60° to 200° C. and the time of exposure is in the range of 5 to 300 seconds more preferably in the range of 5 to 120 seconds. This process step normally will cause the material of layer 14 to cross link, providing high thermal stability. If necessary or desirable, an additional bake can be provided to further cross link the material of layer 14, for example, a bake of at a temperature of about 190° C. for a time of one hour.

Figure 4:
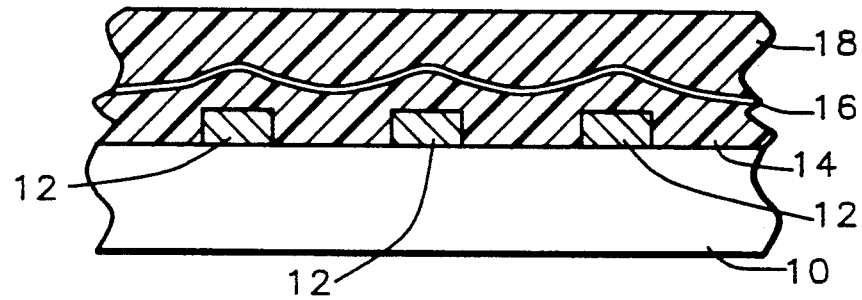
Figure 5:
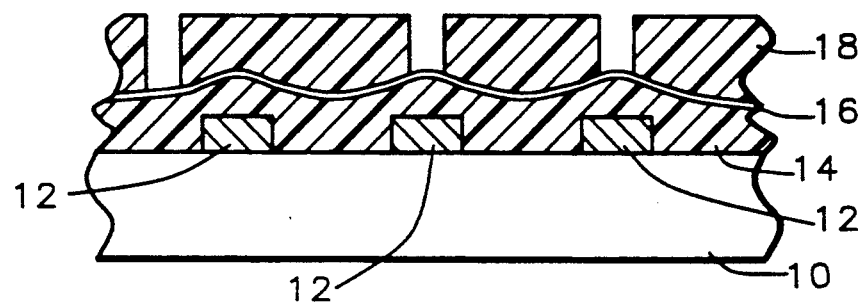

As shown in FIG. 4, a photoresist layer 18 is spun, or otherwise deposited, over layer 14 to provide a planar top surface. The layer 18 has a thickness in the range of 0.8 to 1.5 micrometers. The layer 18 is exposed and developed to provide a new pattern, as indicated in FIG. 5. A very small and well defined pattern can be obtained in resist layer 18, because the top surface is planar, and because the dye in layer 14 is antireflective. This resist layer 18 is composed of high resolution resists, such as Shipley SPR2, TOK V3, KTI 895, and the like. This layer 18 must be composed of a high resolution resist material.

Figure 6:
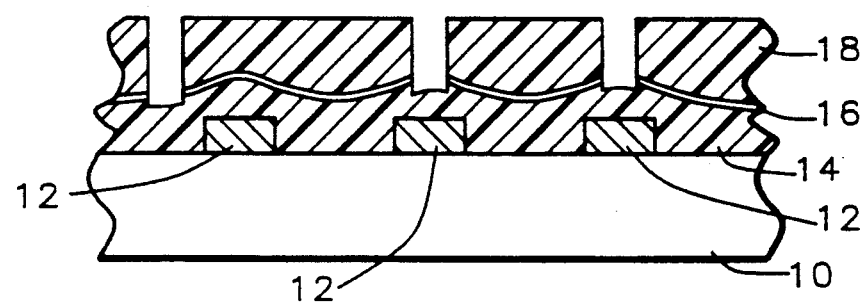
Figure 7:
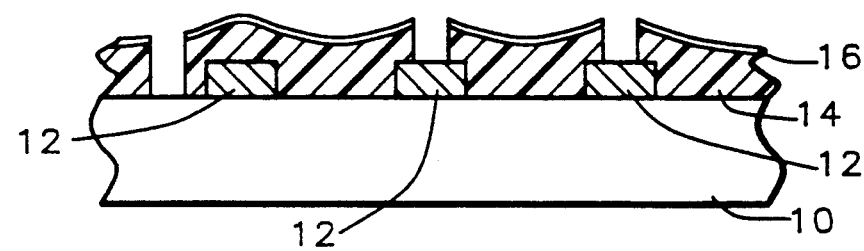

As shown in FIG. 6, the surface structure is exposed to reactive ion etching plasma for a time sufficient to remove the top surface of layer 14 through silicon containing layer 16 in the areas that are exposed by resist layer 18. The reactive plasma suited to achieve this result is produced by $CHF_3$, $CF_4$, and the like under conventional etching ambient and conditions. The reactive etch is then converted to an oxygen gas only etch that etches the rest of the way through layer 14, as shown in FIG. 7. The resist layer 18 is also eroded at this time until the silicon containing layer 16 is reached. At this point the silicon reacts with the reactive oxygen and forms silicon oxide. The silicon oxide forms a barrier to the oxygen etch and protects the underlying portions of layer 14. The structure has now been completed through the lithography step and is ready for further processing.

While the invention has been particularly shown and described with reference to the preferred embodiments thereof, it will be understood by those skilled in the art that various changes in form and details may be made without departing from the spirit and scope of the invention.

What is claimed is:

1. An improved process for forming a patterned masking layer having a desired pattern of areas on the top surface of a semiconductor wafer using a multi-level resist system comprising:

forming on the top surface of said wafer a planarizing first layer of an organic polymer that is reactive with an organic silane compound;

exposing said first layer to a silicon containing medium for a period of time and at a temperature sufficient to cause partial penetration of silicon into said first layer;

depositing a resist layer over the first layer, exposing the resist layer to the desired pattern, and developing the resist layer to expose areas of said first layer that define said desired pattern;

exposing the wafer of a reactive ion etching environment for a time sufficient to partially remove the exposed areas of said first layer including the silicon that penetrated the first layer;

exposing the wafer to further reactive ion etching with an oxygen plasma in which the resist layer is eroded away to expose the silicon in the first layer which is then converted to silicon oxide by reaction with the oxygen plasma; and continuing the reactive ion etching in an oxygen plasma wherein the silicon oxide protects the first layer regions, but allow unprotected areas defining said desired pattern to be eroded away.

2. The method of claim 1 wherein said organic polymer of said first layer is a material selected from the group consisting of Novolak resins, polyphenol resins, polyepoxide resins, polyvinyl alcohol, and mixtures thereof.

3. The method of claim 2 wherein the thickness of said first layer is in the range of about 0.8 to 3.0 micrometers.

4. The method of claim 2 wherein the thickness of said first layer is in the range of 0.8 to 1.5 micrometers.

5. The method of claim 2 wherein a dye is embodied in said first layer, the dye is antireflective.

6. The method of claim 5 wherein said dye is a benzylphenone.

7. The method of claim 5 wherein said silicon containing medium is selected from the group consisting of hexamethyldisilazane, tetramethyldisilazane, bisaminosiloxane, hexamethyl cyclotrisilazane and mixtures thereof.

8. The method of claim 7 wherein the time of exposure of said first layer to said silicon containing medium is the range of about 5 to 300 seconds and at a temperature in the range of about 60° to 200° C.

9. The method of claim 8 wherein the wafer, following exposure to a silicon containing medium, is baked to further cross link the material of said first layer.

10. The method of claim 8 wherein the depth of penetration of silicon into said first layer is in the range of about 0.1 to 0.5 micrometers.

11. The method of claim 10 wherein the initial ion etching environment to remove the top layer portion of said first layer, including the silicon, includes $CHF_3$.

12. The method of claim 11 wherein the exposure time of the wafer to the initial reactive ion etching environment is in the range of about 5 to 120 seconds.

13. The method of claim 8 wherein the thickness of said resist is in the range of about 0.8 to 1.5 micrometers.

14. An improved process for forming a patterned masking layer having a desired pattern on the top surface of a semiconductor wafer using a multi-level resist system comprising:

forming on the top surface of said wafer a planarizing first layer of an organic polymer that is reactive with an organic silane compound;

exposing said first layer to a hexamethyldisilizane medium for a period of time and at a temperature sufficient to cause partial penetration of silicon into said first layer in the range of about 0.1 to 0.5 micrometers;

depositing a resist layer over the first layer, exposing the resist layer to the desired pattern, and developing the resist layer to expose areas of said first layer that define said desired pattern;

exposing the wafer to a reactive ion etching environment for a time sufficient to partially remove the exposed areas of said first layer including the silicon that penetrated the first layer;

exposing the wafer to further reactive ion etching with an oxygen plasma in which the resist layer is eroded away to expose the silicon in the first layer which is then converted to silicon oxide by reaction with the oxygen plasma; and continuing the reactive ion etching in an oxygen plasma wherein the silicon oxide protects the first layer regions, but allow unprotected areas defining said desired patterns to be eroded away.

15. The method of claim 14 wherein said organic polymer of said first layer is a material selected from the group consisting of Novolak resin, polyphenol resin, polyepoxide resin, polyvinyl alcohol, and mixtures thereof.

16. The method of claim 15 wherein the thickness of said first layer is in the range of about 0.8 to 3.0 micrometers.

17. The method of claim 14 wherein time of exposure of said first layer to said silicon containing medium is the range of about 50 to 200 seconds and at a temperature in the range of about 60° to 200° C.

18. The method of claim 17 wherein the wafer, following exposure to a silicon containing medium, is baked to further cross link the material of said first layer.

* * * * *